United States Patent
Ota et al.

(10) Patent No.: US 9,786,630 B2
(45) Date of Patent: Oct. 10, 2017

(54) SEMICONDUCTOR DEVICE MANUFACTURING METHOD AND SEMICONDUCTOR WAFER

(71) Applicant: Renesas Electronics Corporation, Koutou-ku, Tokyo (JP)

(72) Inventors: Yuichi Ota, Gunma (JP); Kentaro Kita, Ibaraki (JP); Takehiro Oura, Gunma (JP); Kohei Yoshida, Gunma (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/331,957

(22) Filed: Oct. 24, 2016

(65) Prior Publication Data

US 2017/0186725 A1    Jun. 29, 2017

(30) Foreign Application Priority Data

Dec. 24, 2015  (JP) .................................. 2015-250866

(51) Int. Cl.
  *H01L 21/768* (2006.01)
  *H01L 23/544* (2006.01)
  (Continued)

(52) U.S. Cl.
  CPC ............ *H01L 24/94* (2013.01); *H01L 21/304* (2013.01); *H01L 21/6836* (2013.01);
  (Continued)

(58) Field of Classification Search
  CPC ... H01L 2224/45015; H01L 2223/5446; H01L 2224/48227; H01L 24/11; H01L 24/05; H01L 2224/0401; H01L 2224/11334; H01L 21/2007; H01L 2224/48228; H01L 2224/05009
  See application file for complete search history.

(56) References Cited

U.S. PATENT DOCUMENTS

2002/0011655 A1* 1/2002 Nishiyama ............ H01L 21/561
                                                                257/688
2013/0181329 A1* 7/2013 Wada .................... H01L 23/562
                                                                257/620

FOREIGN PATENT DOCUMENTS

JP    H11-45868 A    2/1999
JP    2007-036129 A   2/2007

* cited by examiner

*Primary Examiner* — Jasmine Clark
(74) *Attorney, Agent, or Firm* — Shapiro, Gabor and Rosenberger, PLLC

(57) ABSTRACT

A semiconductor device manufacturing method improves the yield of manufacturing semiconductor devices. There are provided an insulating film for covering multiple bonding pads, a first protective film over the insulating film, and a second protective film over the first protective film. In semiconductor chips, multiple electrode layers are coupled electrically to each of the bonding pads via first openings formed in the insulating film and second openings formed in the first protective film. Multiple bump electrodes are coupled electrically to each of the electrode layers via third openings formed in the second protective film. In pseudo chips, the second openings are formed in the first protective film and the third openings are formed in the second protective film. The insulating film is exposed at the bottom of the second openings coinciding with the third openings. A protective tape is applied to a principal plane to cover the bump electrodes.

20 Claims, 17 Drawing Sheets

(51) Int. Cl.
    *H01L 23/00*      (2006.01)
    *H01L 21/683*     (2006.01)
    *H01L 21/8238*    (2006.01)
    *H01L 21/304*     (2006.01)
    *H01L 21/78*      (2006.01)
(52) U.S. Cl.
    CPC ...... *H01L 21/78* (2013.01); *H01L 21/823814*
        (2013.01); *H01L 21/823871* (2013.01); ***H01L
        21/823892* (2013.01); *H01L 23/544*** (2013.01);
        *H01L 24/05* (2013.01); *H01L 24/11* (2013.01);
            *H01L 24/13* (2013.01); *H01L 2221/68327*
        (2013.01); *H01L 2221/68386* (2013.01); *H01L
            2223/5446* (2013.01); *H01L 2224/0218*
        (2013.01); *H01L 2224/0219* (2013.01); *H01L
            2224/02206* (2013.01); *H01L 2224/02215*
        (2013.01); *H01L 2224/0401* (2013.01); *H01L
            2224/05082* (2013.01); *H01L 2224/05147*
        (2013.01); *H01L 2224/05155* (2013.01); *H01L
            2224/1132* (2013.01); *H01L 2224/1181*
        (2013.01); *H01L 2224/11334* (2013.01); *H01L
            2224/11464* (2013.01); *H01L 2224/11849*
        (2013.01); *H01L 2224/13026* (2013.01); *H01L
            2924/04941* (2013.01); *H01L 2924/07025*
                                            (2013.01)

FIG. 11
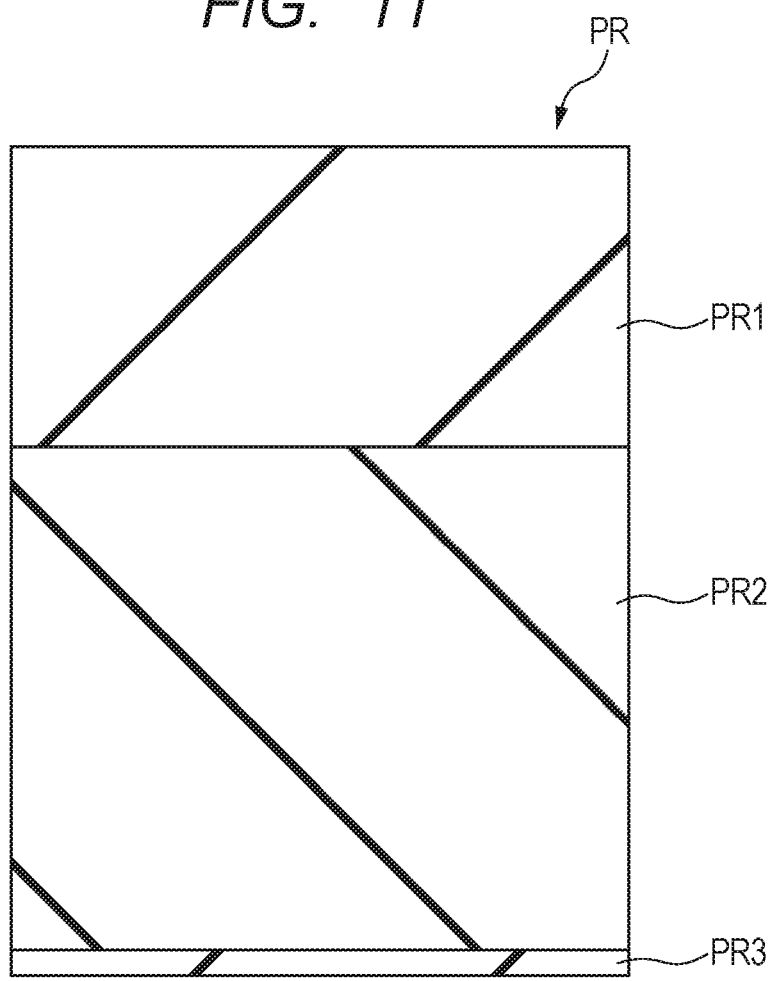
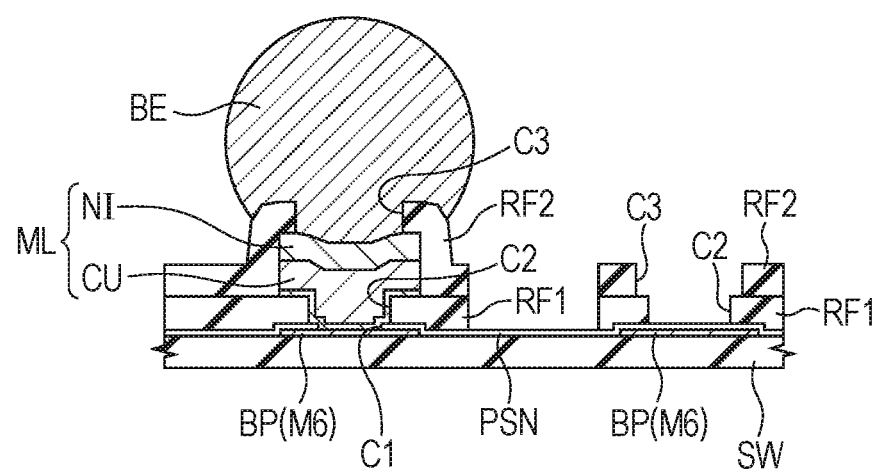

SEMICONDUCTOR DEVICE MANUFACTURING METHOD AND SEMICONDUCTOR WAFER

CROSS-REFERENCE TO RELATED APPLICATIONS

The disclosure of Japanese Patent Application No. 2015-250866 filed on Dec. 24, 2015 including the specification, drawings and abstract is incorporated herein by reference in its entirety.

BACKGROUND

The present invention relates to a semiconductor device manufacturing method and a semiconductor wafer. More particularly, the invention relates to an improved method of manufacturing, over the principal plane of a semiconductor wafer, semiconductor devices each having a plurality of bump electrodes therein.

Japanese Unexamined Patent Application Publication No. 2007-36129 describes a technology in which a passivation film is removed from the scribe lines in such a manner that the film is left intact over regions several millimeters from the wafer periphery, so that the gap between the scribe lines and a protective tape is closed before the wafer periphery is reached.

Japanese Unexamined Patent Application Publication No. Hei 11(1999)-45868 describes a technology in which components having the same pattern as that of the components in a product chip area are formed in a pseudo chip area where incomplete pseudo chips failing to make up product chips are formed, so as to improve the uniformity of the thickness of a polishing film left from the chemical mechanical polishing (CMP) process.

SUMMARY

Adopted generally today is the method in which a plurality of bump electrodes electrically coupled to the wiring of the topmost layer of a semiconductor integrated circuit are formed for each of a plurality of semiconductor chips fabricated over a semiconductor wafer, before the back of the semiconductor wafer is polished. The polishing process requires applying a protective tape to the principal plane of the semiconductor wafer in a manner covering the multiple bump electrodes. The need to apply the protective tape can incur problems: the protective tape can be difficult to peel off, the tape adhering strongly to a wall made of photosensitive polyimide and formed around the periphery of the principal plane of the semiconductor wafer to prevent the intrusion of water during the polishing process (e.g., see the above-cited Japanese Unexamined Patent Application Publication No. 2007-36129); or after the protective tape is peeled off, the glue of the tape might be left on the bump electrode surfaces, causing a conduction failure.

According to one embodiment of the present invention, there is provided a semiconductor device manufacturing method including: the step of preparing a semiconductor wafer having a principal plane, a circumferential edge surrounding the principal plane, a plurality of first chips formed over the principal plane and including semiconductor elements, and a plurality of second chips surrounding the first chips and contiguous with the circumferential edge, each of the first chips having a plurality of bonding pads formed therein; the step of forming an insulating film over the principal plane, before forming a plurality of first openings in the insulating film of the first chips to expose the bonding pads at the bottom of the first openings; the step of forming a first protective film over the principal plane, before forming a plurality of second openings in the first protective film of the first and the second chips in such a manner that the bonding pads are exposed at the bottom of the first openings coinciding with the second openings in planar view of the first chips and that the insulating film is exposed at the bottom of the second openings of the second chips; the step of forming a plurality of electrode layers coupled electrically to each of the bonding pads via the first and the second openings; the step of forming a second protective film over the principal plane, before forming a plurality of third openings in the second protective film of the first and the second chips in such a manner that the electrode layers are exposed at the bottom of the third openings of the first chips and that the insulating film is exposed at the bottom of the second openings coinciding with the third openings in planar view of the second chips; the step of forming a plurality of external electrodes coupled electrically to each of the electrode layers; and the step of applying a protective tape to the principal plane in a manner covering the external electrodes.

According to another embodiment of the present invention, there is provided a semiconductor wafer including: a principal plane; a circumferential edge surrounding the principal plane; a plurality of first chips formed over the principal plane and including semiconductor elements; a plurality of second chips surrounding the first chips and contiguous with the circumferential edge; a plurality of bonding pads formed in each of the first chips; an insulating film formed over the principal plane in a manner covering the bonding pads; a plurality of first openings formed in the insulating film of the first chips in a manner partially exposing the top of the bonding pads; a first protective film formed over the insulating film; a plurality of second openings formed in the first protective film of the first chips in a manner coinciding with the first openings in planar view to partially expose the top of the bonding pads; a plurality of third openings formed in the first protective film of the second chips to expose the insulating film; a plurality of electrode layers coupled electrically to each of the bonding pads via the first and the second openings; a second protective layer famed over the principal plane in a manner covering the electrode layers; a plurality of fourth openings formed over the second protective film of the first chips to partially expose the top of the electrode layers; a plurality of fifth openings formed in the second protective film of the second chips in a manner coinciding with the third openings in planar view to expose the insulating film; a plurality of external electrodes coupled electrically to each of the electrode layers via the fourth openings; and a protective tape applied to the principal plane in a manner covering the external electrodes.

Thus according to the embodiments of the present invention, the yield of manufacturing semiconductor devices is improved.

Further objects and advantages of the present invention will become apparent upon a reading of the description that follows and the appended drawings.

BRIEF DESCRIPTION OF THE DRAWINGS

FIG. 11 is a sectional view showing another semiconductor device manufacturing process continued from FIG. 10;

DETAILED DESCRIPTION

Figure 1:
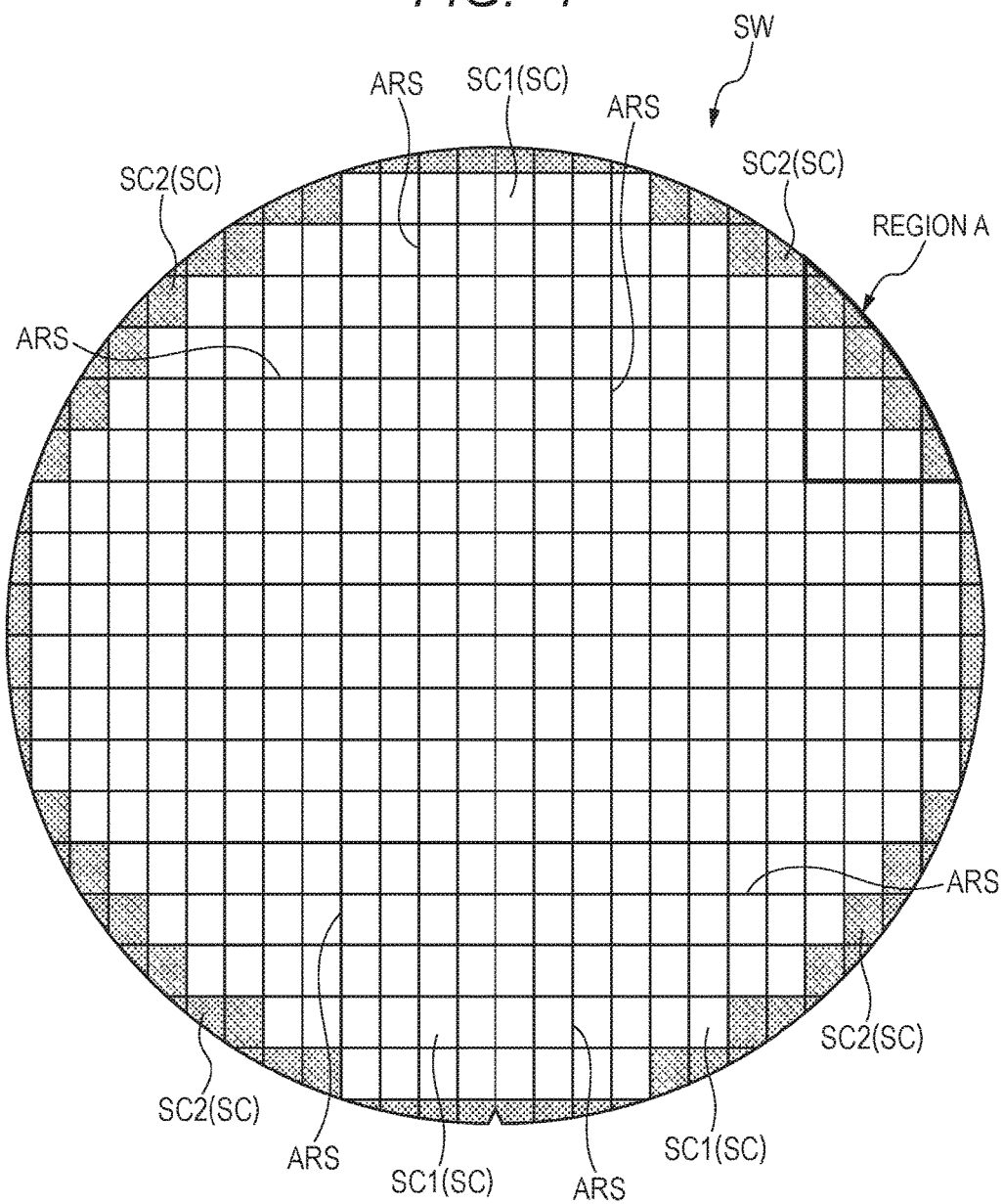
FIG. 1 is a top view showing the principal plane of a semiconductor wafer where a plurality of semiconductor chips are formed according to one embodiment of the present invention.

In the ensuing description of each preferred embodiment of the present invention, the embodiment may be explained in a plurality of sections or examples as needed. These sections or examples are not unrelated to each other but are variable of, explanatory of, or complementary to each other unless specified otherwise.

In the description below of each preferred embodiment, references to the numerical aspects of the composing elements making up the embodiment (including quantities, values, amounts, and ranges) denote merely examples and are not limitative of the embodiment unless specified otherwise or unless the numbers are obviously determined theoretically.

In the description that follows of each preferred embodiment, the composing elements (including steps) including the embodiment are obviously not indispensable unless specified otherwise or unless they are clearly deemed indispensable theoretically.

Further, the expressions such as "made of A," "formed of A," "having A," and "including A" do not exclude elements other than A unless otherwise specified. Likewise, in the ensuing description of each preferred embodiment, references to the shapes or the positional relations of the composing elements include shapes, configurations, or positional relations approximate or similar to those stated unless specified otherwise or unless what is stated is obviously exclusive of everything else theoretically. This also holds for the above-mentioned values and ranges of the elements.

In the accompanying drawings explanatory of preferred embodiments described hereunder, the size of each drawn part does not necessarily reflect its actual size in the actual device. Particular parts may be shown relatively enlarged for visibility purposes. In the description that follows, like reference numerals will be understood in principle to refer to like parts, components, or structures, and their explanations will be omitted where redundant.

Some preferred embodiments of the present invention will now be described below in detail with reference to the accompanying drawing.

Embodiments

<<Semiconductor Wafer where a Plurality of Semiconductor Chips are Formed>>

Figure 2:
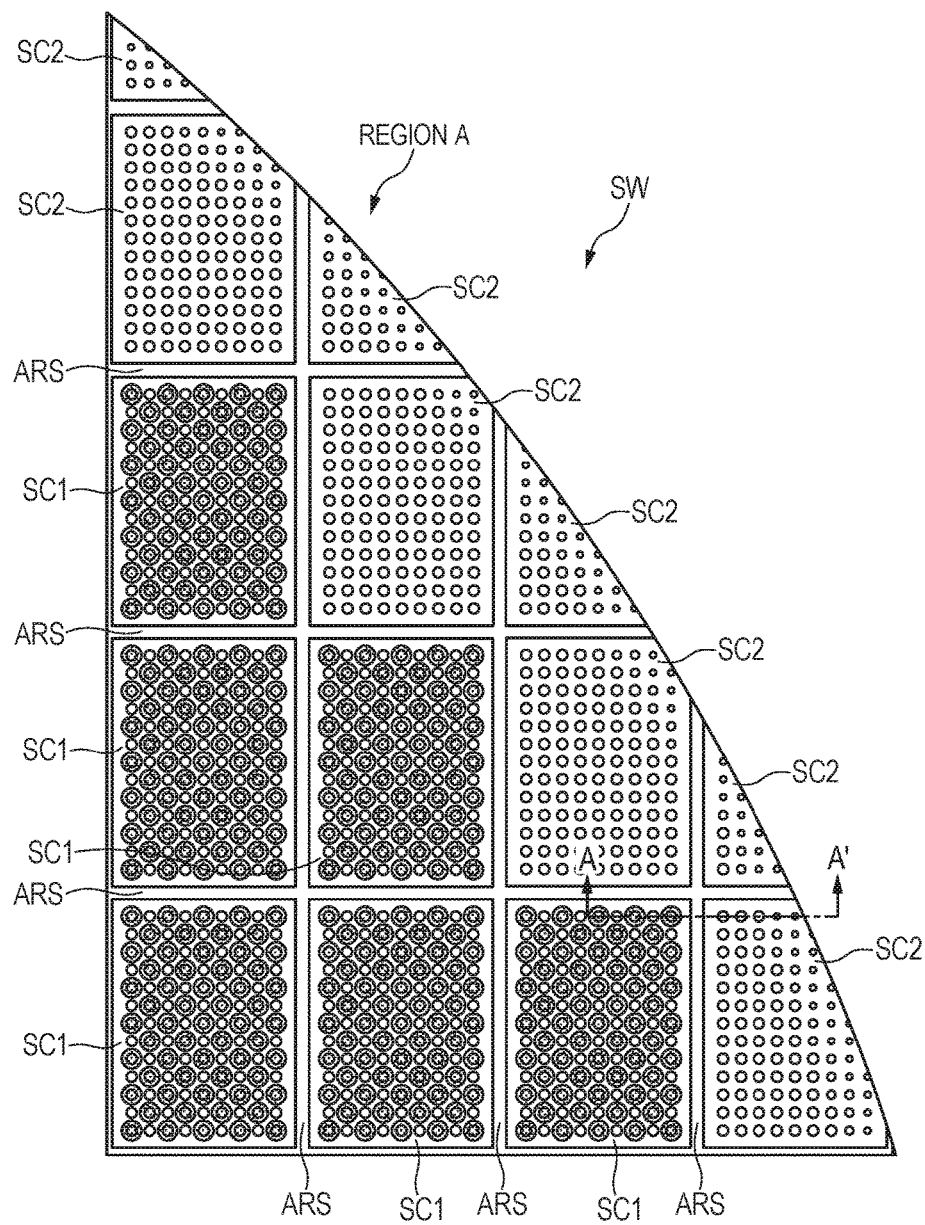
FIG. 2 is a top view magnifying region A in FIG. 1.
Figure 3:
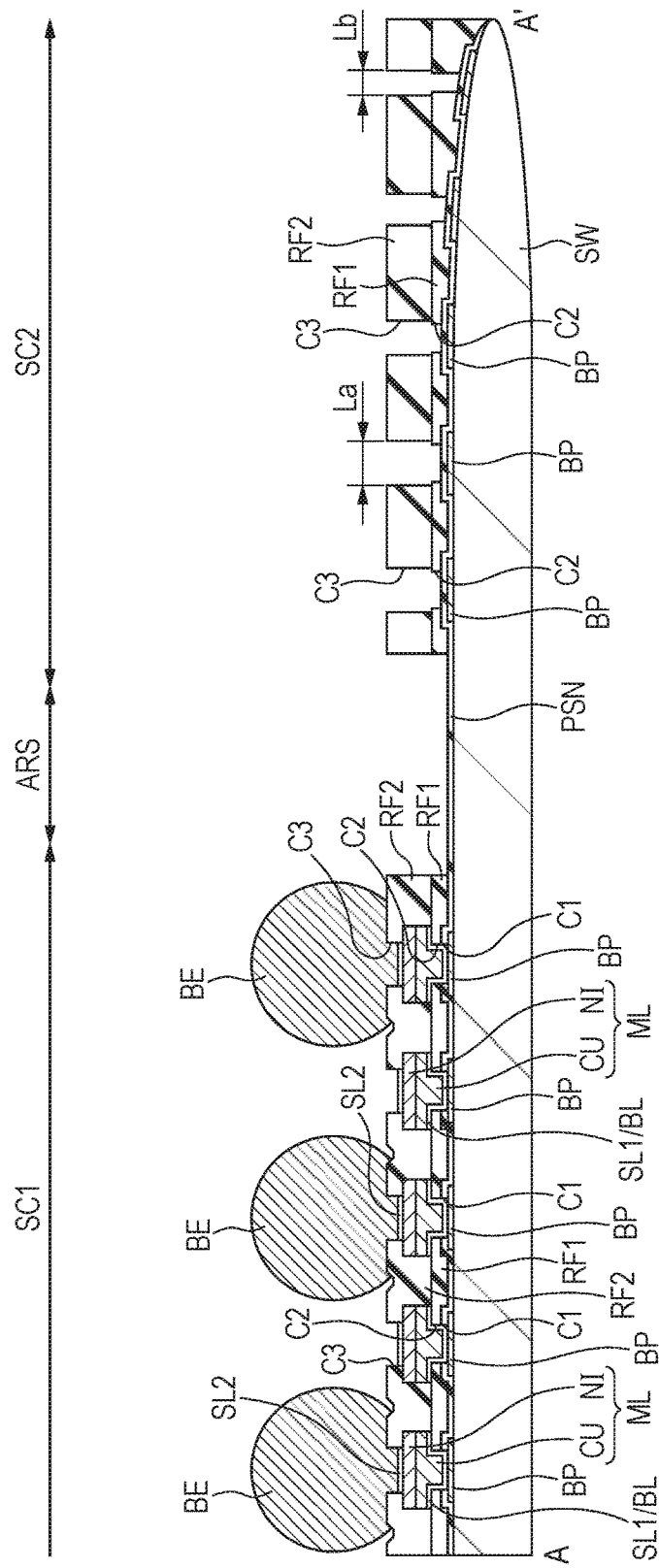
FIG. 3 is a sectional view taken on line A-A' in FIG. 2.
Figure 4:
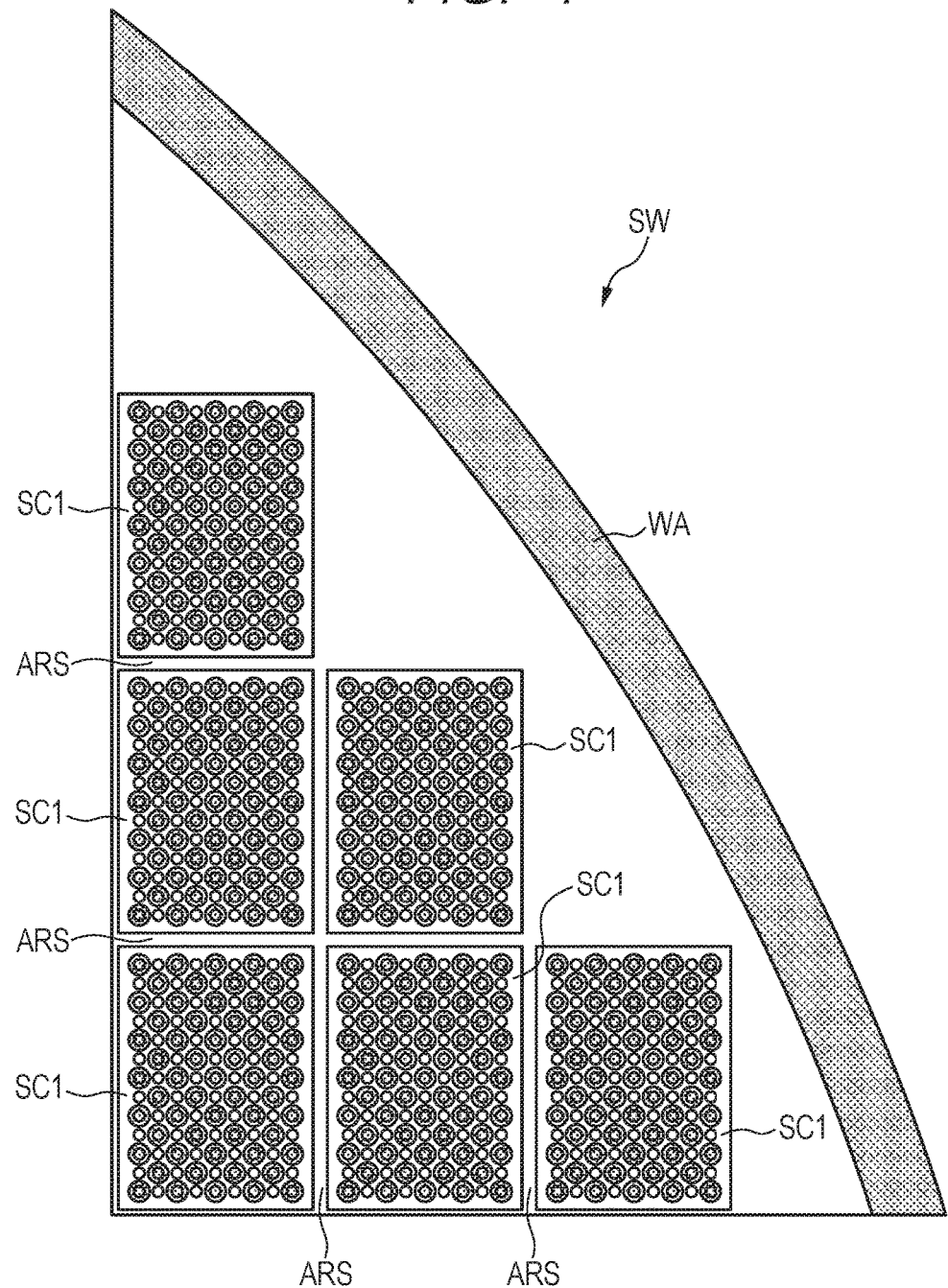
FIG. 4 is a top view magnifying partially the state of the principal plane of a semiconductor wafer where a plurality of semiconductor chips are formed for comparative reviews by the inventors.

Described below using FIGS. 1 to 4 is a semiconductor wafer where a plurality of semiconductor chips are formed as one embodiment of the present invention. FIG. 1 is a top view showing the state of the principal plane of a semiconductor wafer where a plurality of semiconductor chips are formed according to one embodiment of the present invention. FIG. 2 is a top view magnifying region A in FIG. 1. FIG. 3 is a sectional view taken on line A-A' in FIG. 2. FIG. 4 is a top view magnifying partially the state of the principal plane of a semiconductor wafer where a plurality of semiconductor chips are formed for comparative reviews by the inventors.

As shown in FIGS. 1 and 2, the principal plane (first principal plane, surface) of the semiconductor wafer SW has a plurality of semiconductor chips SC formed in a manner segmented by lattice-shaped scribe areas (scribe line spacing) ARS. Each of the scribe areas ARS is about 90 to 110 µm wide, for example. The semiconductor chips SC are made up of product chips SC1 and pseudo chips SC2. The product chips SC1 are each a finished chip in which a semiconductor integrated circuit device is formed. The pseudo chips SC2 are each an incomplete chip failing to include a product chip SC1, the pseudo chips SC2 being contiguous with a circumferential edge of the semiconductor wafer SW in its peripheral region (in FIG. 1, the pseudo chips SC2 are indicated by half-tone dot meshing).

As shown in FIG. 3, the product chip SC1 and the pseudo chip SC2 each have bonding pads BP included by the wiring of the topmost layer in the semiconductor integrated circuit device. The bonding pads BP are covered by an insulating film PSN. In the product chip SC1, first openings C1 exposing the top of the bonding pads BP are formed at a first pitch in the insulating film PSN. The insulating film PSN is made of a silicon nitride film, a silicon oxide film, or a stacked film formed of a silicon nitride film and a silicon oxide film, for example.

In the pseudo chip SC2, on the other hand, the bonding pads BP are covered by the insulating film PSN.

The insulating film PSN is further covered by a first protective film RF1 made of photosensitive polyimide. In the product chip SC1, second openings C2 coinciding with the first openings C1 in planar view are famed at the first pitch in the first protective film RF1. Thus at the bottom of the first openings C1 coinciding with the second openings C2, the top of the bonding pads BP is exposed. In the pseudo chip SC2, the second openings C2 are formed likewise at the first pitch in the first protective film RF1.

It should be noted that the opening space of each second opening C2 formed in the pseudo chip SC2 may be smaller than the opening space of each second opening C2 formed in the product chip SC1. In particular, the closer the circumferential edge of the semiconductor wafer SW is approached, the smaller the opening space of each second opening C2 formed in the pseudo chips SC2 tends to be. The opening space of the second opening C2 closest to the circumferential edge is the smallest.

Also in the product chip SC1, an electrode layer ML (under-bump metal UBM) is coupled electrically to the bonding pads BP via the first openings C1 and second openings C2. The electrode layer ML is typically a stacked layer included by a lower layer that is a first metal layer CU made of a copper (Cu) plating film and by an upper layer that is a second metal layer NI made of a nickel (Ni) plating film. Interposed between the bonding pads BP and the electrode layer ML is a stacked layer included by a lower layer that is a barrier layer BL made of titanium nitride (TiN) and by an upper layer that is a seed layer SL1 made of copper (Cu), for example.

In the pseudo chip SC2, on the other hand, the second openings S2 are formed but the barrier layer BL, seed layer SL1, and electrode layer ML are not fabricated.

Further over the electrode layer ML, a second protective film RF2 made of photosensitive polyimide is formed. In the product chip SC1, third openings C3 coinciding with the second openings C2 in planar view are famed in the second protective film RF2 at the first pitch. The third openings C3 thus expose the upper surface of the electrode layer ML. In the pseudo chip SC2, too, the third openings C3 coinciding with the second openings C2 in planar view are famed in the second protective film RF2 at the first pitch. The insulating film PSN is thus exposed at the bottom of the second openings C2 coinciding with the third openings C3.

It should be noted that the opening space of each third opening C3 formed in the pseudo chips SC2 may be smaller than the opening space of each third opening C3 in the product chips SC1. In particular, the closer the circumferential edge of the semiconductor wafer SW is approached, the smaller the opening space of each third opening C3 formed in the pseudo chips SC2 tends to be. The opening space of the third opening C3 closest to the circumferential edge is the smallest. For example, if the third openings C3 have a columnar shape each, the diameter Lb of the third opening C3 closest to the circumferential edge is smaller than the diameter La of each of the other third openings C3.

From the scribe areas ARS, the first protective film RF1 and the second protective film RF2 are removed to expose the insulating film PSN.

Further in the product chip SC1, the bump electrodes BE are coupled electrically to the electrode layer ML via the third openings C3. The bump electrodes BE are electrodes that couple with the outside and are made of lead (Pb)-free solder, for example. The diameter of each bump electrode BE is about 60 to 100 μm, for example. Interposed between the electrode layer ML and the bump electrodes BE is a seed layer SL2 typically formed of gold (Au).

In the pseudo chip SC2, meanwhile, the third openings C3 are formed but the seed layer SL2 and the bump electrodes BE are not fabricated. Thus each pseudo chip SC2 has two regions: one in which the first protective film RF1 and the second protective film RF2 are stacked on each other, and the other in which the insulating film PSN is exposed without the first protective film RF1 and the second protective film RF2 being formed.

As will be described later in more detail in connection with the semiconductor device manufacturing method, a protective tape is applied to the principal plane of the semiconductor wafer SW before the back of the semiconductor wafer SW is ground. A glue layer including part of the protective tape has the property of adhering strongly to the second protective film RF2 made of photosensitive polyimide but weakly to the insulating film PSN.

That leads to a problem: When a wall WA made of photosensitive polyimide is formed over the entire circumferential edge of the semiconductor wafer SW as shown in FIG. 4, the protective tape is difficult to peel off from the principal plane of the semiconductor wafer SW because of the strong adherence between the protective tape and the photosensitive polyimide.

According to this embodiment of the present invention, the pseudo chips SC2 located in the peripheral region of the semiconductor wafer SW are each provided with two regions: one in which the first protective film RF1 and the second protective film RF2 each made of photosensitive polyimide are stacked on each other, and the other in which the insulating film PSN is exposed without the stacked film being formed. This structure makes it easier to peel off the protective tape from the principal plane of the semiconductor wafer SW than if the wall WA made of photosensitive polyimide is formed over the entire peripheral region of the semiconductor wafer SW.

Furthermore, as described above, the closer the circumferential edge of the semiconductor wafer SW is approached, the smaller the opening space of each third opening C3 formed in the pseudo chips SC2 tends to be. The opening space of the third opening C3 closest to the circumferential edge is the smallest. The region with the third openings C3 having the smaller opening space each provides stronger adherence between the protective tape and the semiconductor wafer SW than the region with the third openings C3 having the larger opening space each. This structure prevents the protective tape from peeling off from the periphery of the semiconductor wafer SW while the semiconductor wafer SW with the protective tape applied thereto is in transit. At the time of peeling off the protective tape, it is easy to do so because the tape adheres strongly only to the periphery of the semiconductor wafer SW.

There is concern that grinding water supplied while the back of the semiconductor wafer SW is being ground may intrude on the principal plane of the semiconductor wafer SW because the scribe areas ARS are formed up to the peripheral region of the semiconductor wafer SW. However, as will be described later in more detail in connection with the semiconductor device manufacturing method, the level differences of the scribe areas ARS are filled with a protective tape having a soft layer about 200 μm thick. This prevents the intrusion of grinding water onto the principal plane of the semiconductor wafer SW.

<<Semiconductor Device Manufacturing Method>>

A semiconductor device manufacturing method as another embodiment of the present invention is described below in different processes with reference to FIGS. 5 to 12. FIGS. 5 to 12 are sectional views showing the processes for manufacturing semiconductor devices according to this embodiment.

Figure 5:
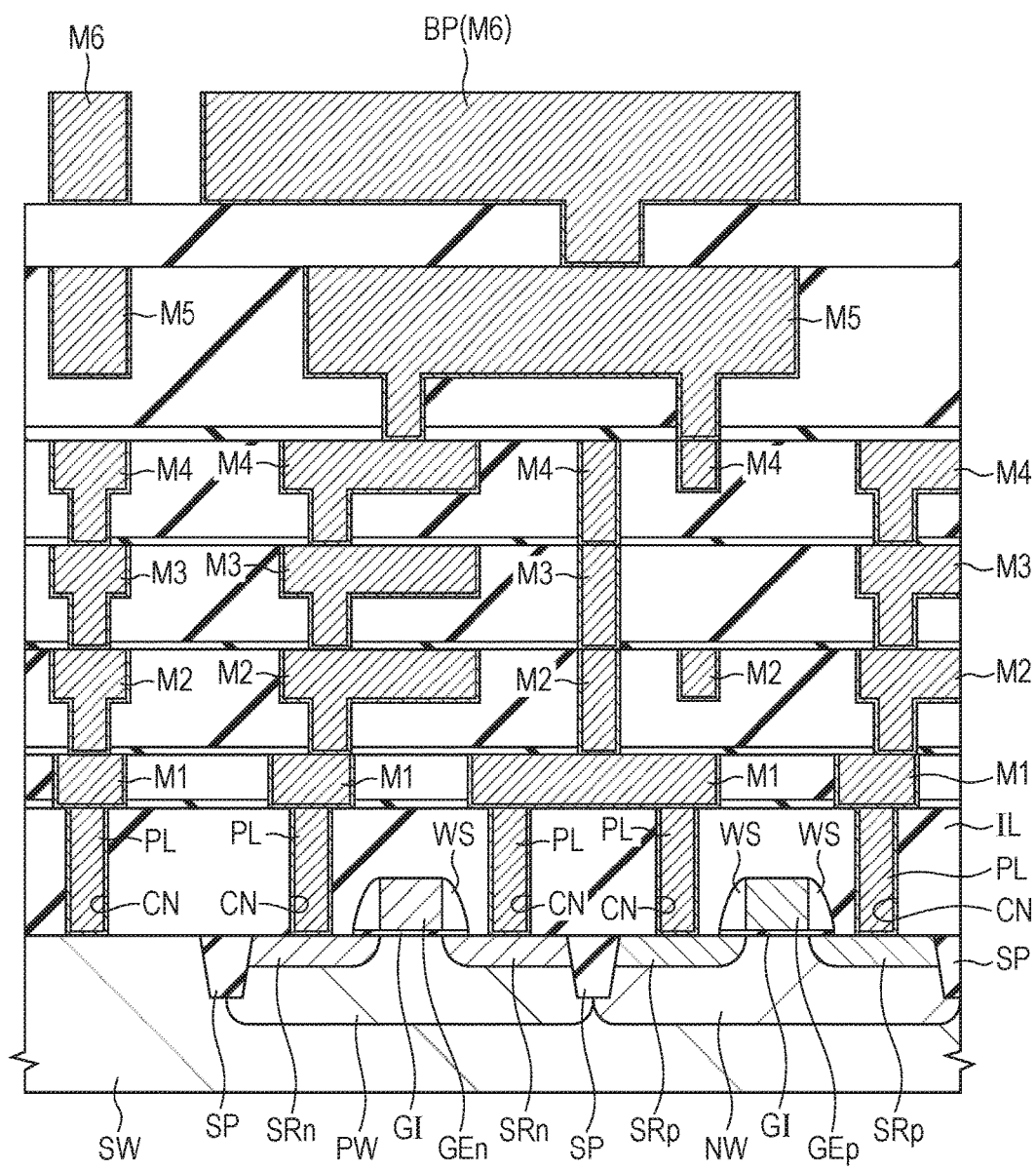
FIG. 5 is a sectional view showing a semiconductor device manufacturing process according to the embodiment of the present invention.

FIG. 5 is a sectional view showing a semiconductor device and its multilayer wiring formed in a semiconductor chip in the product chip area of the semiconductor wafer.

The semiconductor device is a complementary metal oxide semiconductor field effect transistor (CMOSFET) presented here as an example. A p-channel type MOSFET is abbreviated hereunder as pMOS and an n-channel type MOSFET as nMOS.

Figure 12:
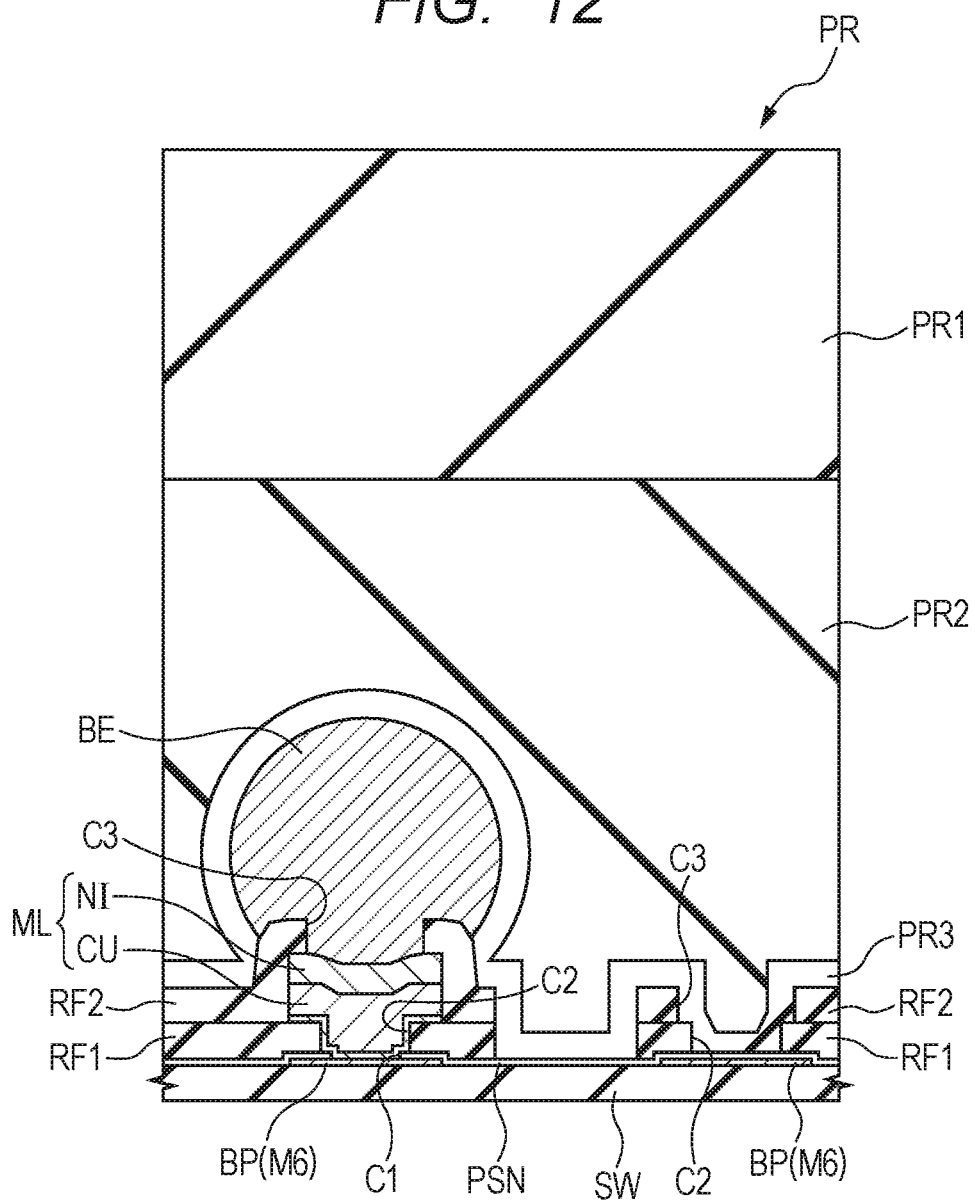
FIG. 12 is a sectional view showing another semiconductor device manufacturing process continued from FIG. 11.

FIGS. 6 to 10 are sectional views showing structures above the topmost layer of the multilayer wiring, with the semiconductor device and the multilayer wiring not shown. FIGS. 11 and 12 are sectional views explanatory of how the protective tape is applied to the principal plane of the semiconductor wafer. In FIGS. 6 to 10, reference character AR1 stands for the product chip area where product chips are formed, AR2 for the pseudo chip area where pseudo chips are formed, and ARS for the scribe areas.

As shown in FIG. 5, a semiconductor wafer (thin, circular plate) formed of silicon monocrystal is first prepared. Separating portions SP made of an insulating film are then formed in an element separation region of the semiconductor wafer SW. Thereafter, the semiconductor wafer SW is ion-implanted with impurities having p-type conductivity to form p-type wells PW. Likewise, the semiconductor wafer SW is ion-implanted with impurities having n-type conductivity to form n-type wells NW.

A gate insulating film GI is then formed over the principal plane of the semiconductor wafer SW. Formed next are nMOS gate electrodes GEn and pMOS gate electrodes GEp, followed by sidewalls WS along the gate electrodes GEn and GEp.

The p-type wells PW on both sides of each gate electrode GEn are then ion-implanted with impurities having n-type conductivity. This forms n-type semiconductor regions SRn each serving as an nMOS source/drain, in a self-aligning manner with respect to the gate electrode GEn and the sidewalls WS. Likewise, the n-type wells NW on both sides of each gate electrode GEn are ion-implanted with impurities having p-type conductivity. This forms p-type semiconductor regions SRp each serving as a pMOS source/drain, in a self-aligning manner with respect to the gate electrode GEp and the sidewalls WS.

An insulating film IL is then formed over the first principal plane of the semiconductor wafer SW. After this, connection holes CN are foiled by etching the insulating film IL using a resist pattern as a mask. The connection holes CN are formed where needed such as over the n-type semiconductor regions SRn and p-type semiconductor regions SRp. Inside each connection hole CN, a plug PL typically having tungsten (W) as its main conductor is formed. Thereafter, first-layer wiring M1 is formed to ensure connection with the plugs PL. The first-layer wiring M1 typically has copper (Cu) as its main conductor and may be formed by a single damascene method.

Second-layer wiring M2 through sixth-layer wiring M6 are then formed above the first-layer wiring M1. The sixth-layer wiring M6 is formed in the product chip area AR1 and in the pseudo chip area AR2 as a wiring layer that functions as the bonding pads BP.

The second-layer wiring M2 through the fifth-layer wiring M5 typically have copper (Cu) as their main conductor and may be formed by a dual damascene method. The sixth-layer wiring M6 typically has aluminum (Al) as its main conductor and is formed of an aluminum film which, deposited over the semiconductor wafer SW, is etched using a resist pattern as a mask. The sixth-layer wiring M6 is about 1 μm thick, for example. Although this embodiment involves using the sixth-layer wiring M6 having aluminum as its main conductor, copper (Cu) may alternatively be adopted as the main conductor of the sixth-layer wiring M6. And whereas the embodiment uses six wiring layers, the number of wiring layers may be varied as needed.

Figure 6:
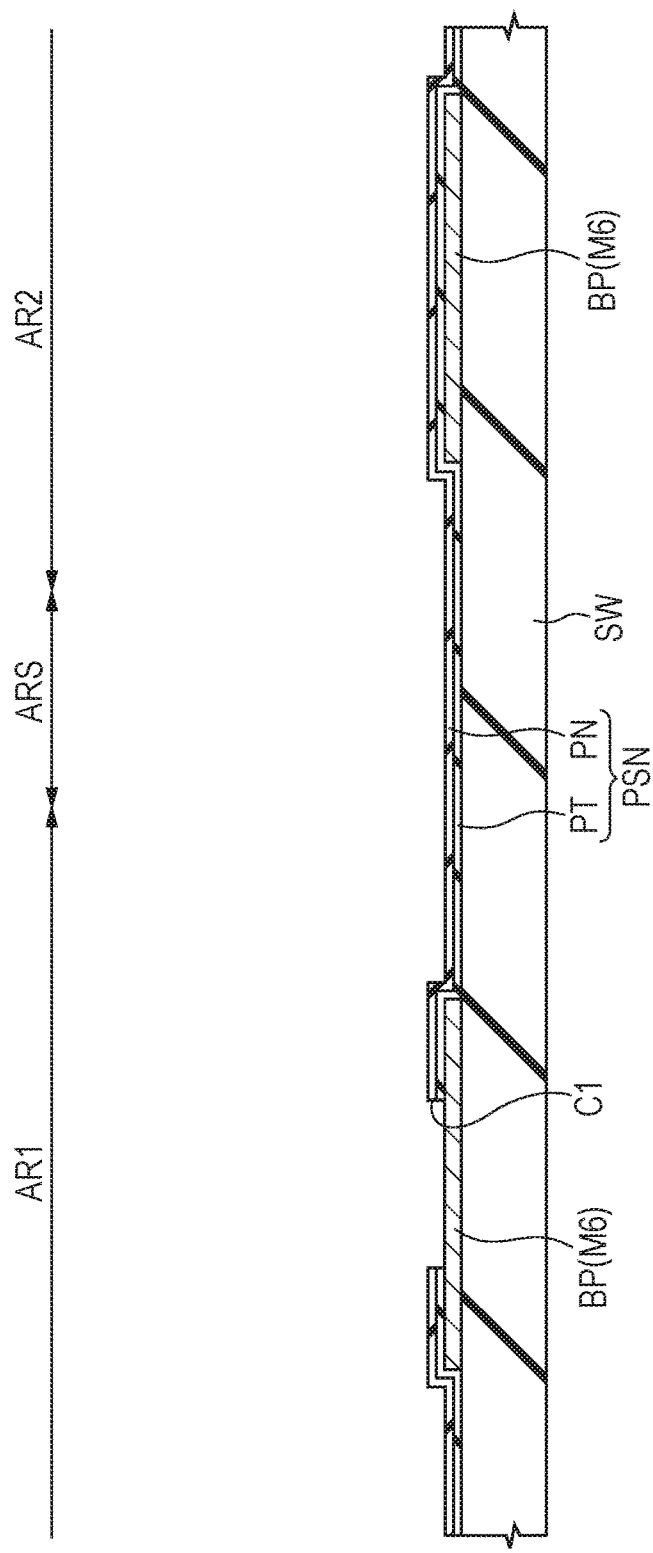
FIG. 6 is a sectional view showing another semiconductor device manufacturing process continued from FIG. 5.

Next, as shown in FIG. 6, a tetra ethyl ortho silicate (TEOS; $Si(OC_2H_5)$) film PT is formed by the plasma chemical vapor deposition (CVD) method using TEOS and ozone ($O_3$) as a source gas. Thereafter, a silicon nitride film PN is formed over the TEOS film PT by the plasma CVD method. The TEOS film PT and the silicon nitride film PN function as an insulating film PSN that prevents the entry of moisture and impurities from the outside and inhibits the permeation of alpha rays.

The silicon nitride film PN and the TEOS film PT are then etched successively using a resist pattern as a mask. This forms first openings C1 that expose the top of the bonding pads BP made of the sixth-layer wiring M6 fabricated in the product chip area AR1.

Figure 7:
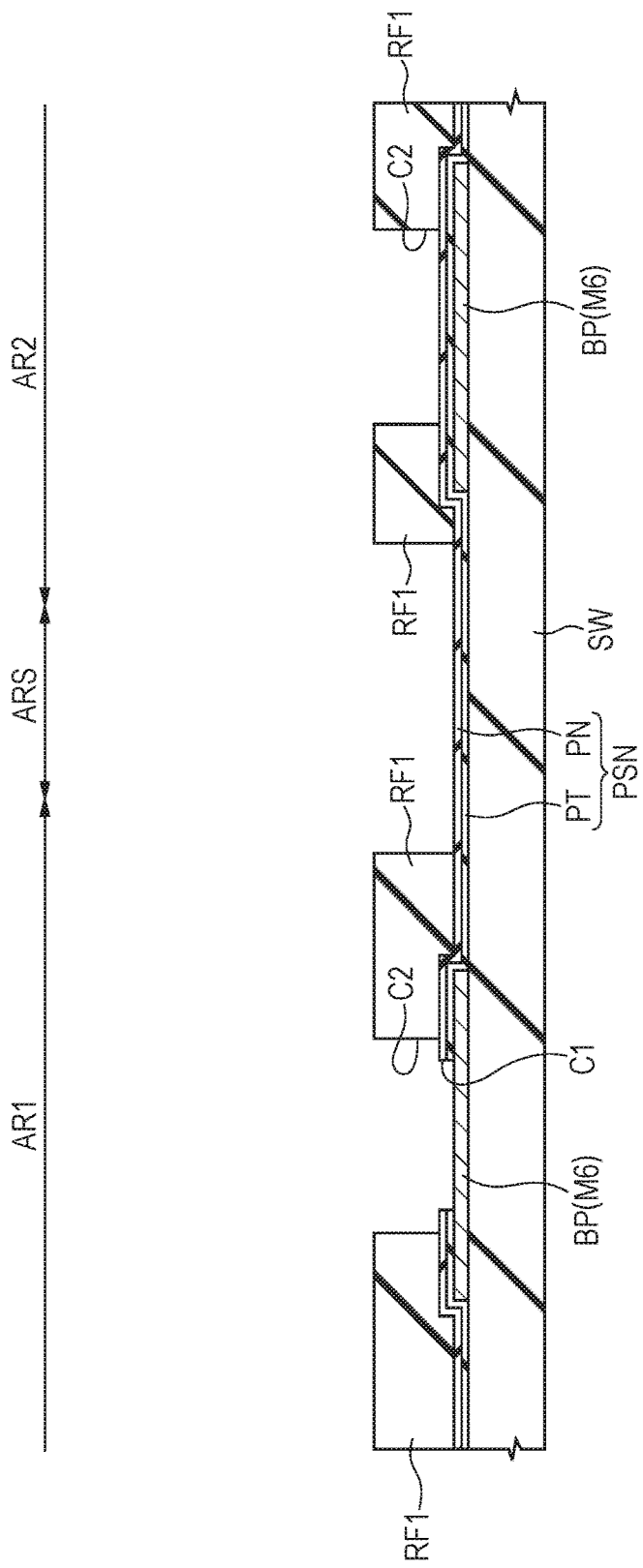
FIG. 7 is a sectional view showing another semiconductor device manufacturing process continued from FIG. 6.

Then as shown in FIG. 7, a first protective film RF1 such as positive photosensitive polyimide is applied to the principal plane of the semiconductor wafer SW. After that, the first protective film RF1 in the product chip area AR1 and pseudo chip area AR2 is exposed and developed. This forms in the first protective film RF1 a plurality of openings C2 for each of the semiconductor chips at the same pitch in the product chip area AR1. The second openings C2 coinciding with the first openings C1 expose the top of the bonding pads BP at the bottom of the first openings C1.

In the same process, a plurality of second openings C2 are formed for each of the semiconductor chips in the pseudo chip area AR2 at the same pitch.

The second openings C2 in the product chip area AR1 and the second openings C2 in the pseudo chip area AR2 are formed using the same exposure mask. For this reason, the pitch of the second openings C2 in the product chip area AR1 is the same as the pitch of the second openings C2 in the pseudo chip area AR2.

However, it should be noted that the peripheral region of the semiconductor wafer SW becomes smaller in thickness the closer the circumferential edge of the semiconductor wafer SW is approached (see the explanation above in reference to FIG. 3). It follows that the distance between the exposure mask and the upper surface of the first insulating film RF1 applied to the peripheral region of the semiconductor wafer SW is greater than the distance between the exposure mask and the upper surface of the first insulating film RF1 applied to the product chip area AR1.

Consequently, the opening space of each second opening C2 formed in the pseudo chip area AR2 is smaller than the opening space of each second opening C2 fabricated in the product chip area AR1. In particular, the closer the circumferential edge of the semiconductor wafer SW is approached, the smaller the opening space of each second opening C2 formed in the pseudo chip area AR2 tends to be. The opening space of the second opening C2 closest to the circumferential edge is the smallest.

Figure 8:
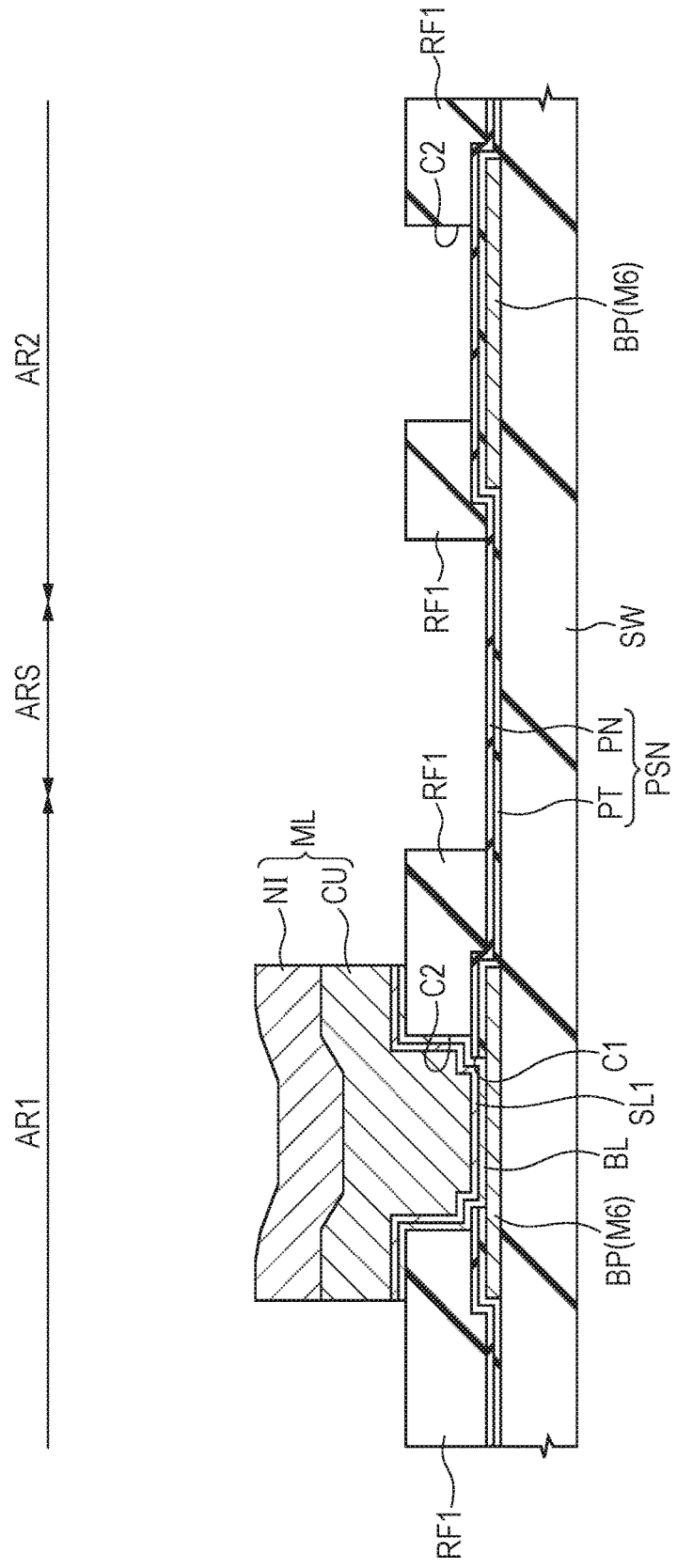
FIG. 8 is a sectional view showing another semiconductor device manufacturing process continued from FIG. 7.

Next, as shown in FIG. 8, a barrier layer BL typically made of titanium nitride (TiN) is formed over the first protective film RF1 including the inner walls of the first openings C1 and the second openings C2. Over the barrier layer BL, a seed layer SL1 made of copper (Cu) is formed by the CVD method or by a sputtering method, for example.

In the product chip area AR1, a resist pattern (not shown) that has openings coinciding with and slightly larger than the second openings C2 is then formed. After this, a first metal film CU is formed over the seed layer SL1. The first metal film CU is a copper (Cu) plating film formed by an electroplating method, for example. The first metal film CU functions as a barrier metal for inhibiting the diffusion of solder, and has the property of offering low contact electrical resistance and low sheet resistance. The thickness of the first metal film CU is about 5 µm, for example. A second metal film NI is further formed over the first metal film CU. The second metal film NI is a nickel (Ni) plating film formed by the electroplating method, for example. The second metal film NI functions as a barrier metal for inhibiting the permeation of solder, and has the property of being highly wettable with solder. The thickness of the second metal film NI is about 3 µm, for example.

After the resist pattern is removed, the exposed seed layer SL1 and the barrier layer BL are removed. This forms, in the product chip area AR1, an electrode layer ML made of the first metal film CU and the second metal film NI stacked on each other. The electrode layer ML is coupled electrically to the bonding pads BP via the first openings C1 and the second openings C2.

Figure 9:
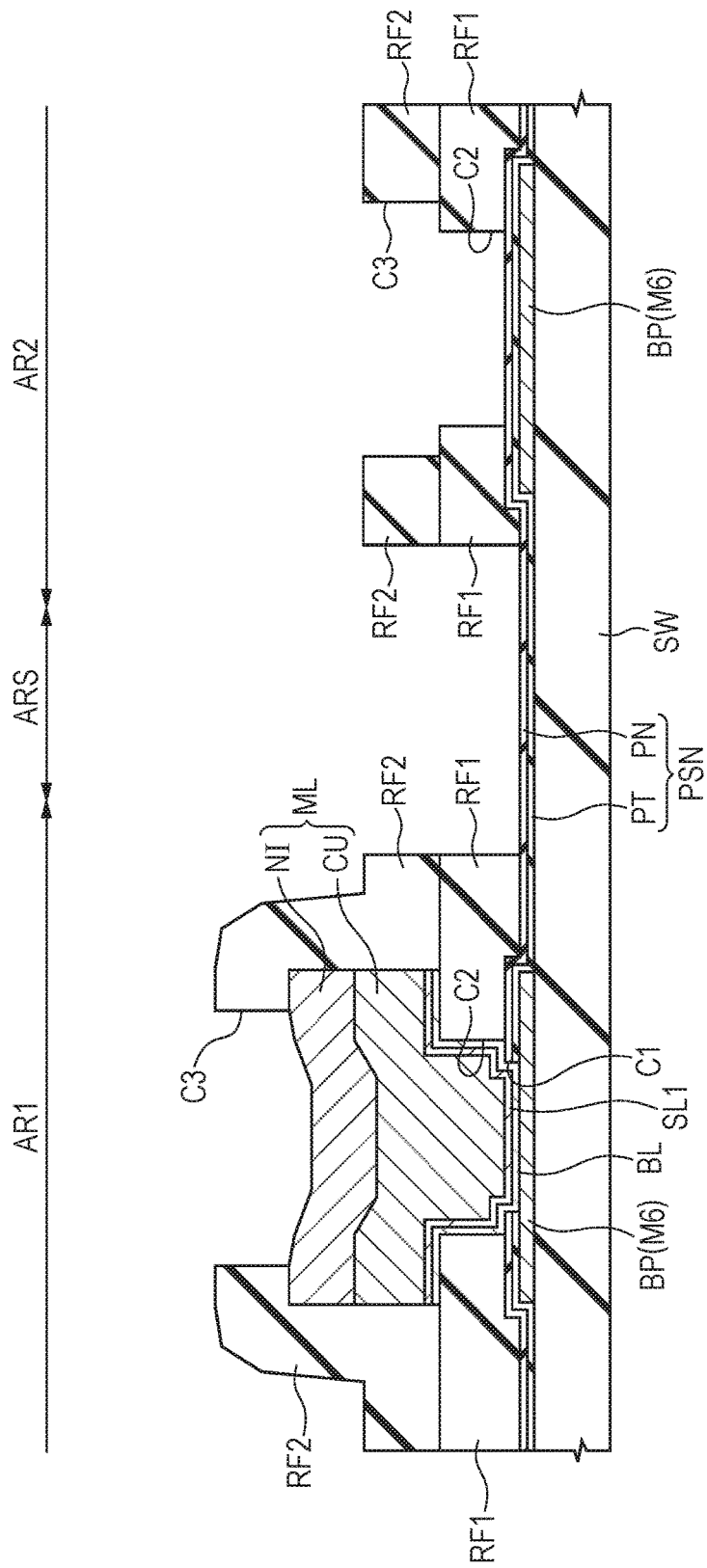
FIG. 9 is a sectional view showing another semiconductor device manufacturing process continued from FIG. 8.

Then as shown in FIG. 9, a second protective film RF2 such as positive photosensitive polyimide is applied to the principal plane of the semiconductor wafer SW in a manner covering the electrode layer ML. The thickness of the first protective film RF1 and the second protective film RF2 combined is about 8 to 10 µm, for example. The second protective film RF2 in the product chip area AR1 and pseudo chip area AR2 is then exposed and developed. This forms a plurality of third openings C3 in the second protective film RF2 for each of the semiconductor chips in the product chip area AR1 at the same pitch. As a result, the upper surface of the electrode layer ML is exposed at the bottom of the third openings C3.

In the same process, a plurality of third openings C3 are formed in the second protective film RF2 for each of the semiconductor chips in the pseudo chip area AR2 at the same pitch. In the pseudo chip area AR2, the third openings C3 coinciding with the second openings C2 cause the insulating film PSN (silicon nitride film PN) to be exposed at the bottom of the second openings C2.

Also in the same process, the first protective film RF1 and the second protective film RF2 are removed from the scribe areas ARS. This exposes the insulating film PSN (silicon nitride film PN) in the scribe areas ARS.

The third openings C3 in the product chip area AR1 and the third openings C3 in the pseudo chip area AR2 are formed using the same exposure mask. For this reason, the pitch of the third openings C3 in the product chip area AR1 is the same as the pitch of the third openings C3 in the pseudo chip area AR2.

It should be noted, as with the above-described second openings C2, that the peripheral region of the semiconductor wafer SW becomes smaller in thickness the closer the circumferential edge of the semiconductor wafer SW is approached (see the explanation above in reference to FIG. 3). It follows that the distance between the exposure mask and the upper surface of the second insulating film RF2 applied to the peripheral region of the semiconductor wafer SW is greater than the distance between the exposure mask and the upper surface of the second insulating film RF2 applied to the product chip area AR1.

Consequently, the opening space of each third opening C3 formed in the pseudo chip area AR2 is smaller than the opening space of each third opening C3 fabricated in the product chip area AR1. In particular, the closer the circumferential edge of the semiconductor wafer SW is approached, the smaller the opening space of each third opening C3 formed in the pseudo chip area AR2 tends to be. The opening space of the third opening C3 closest to the circumferential edge is the smallest.

Figure 10:
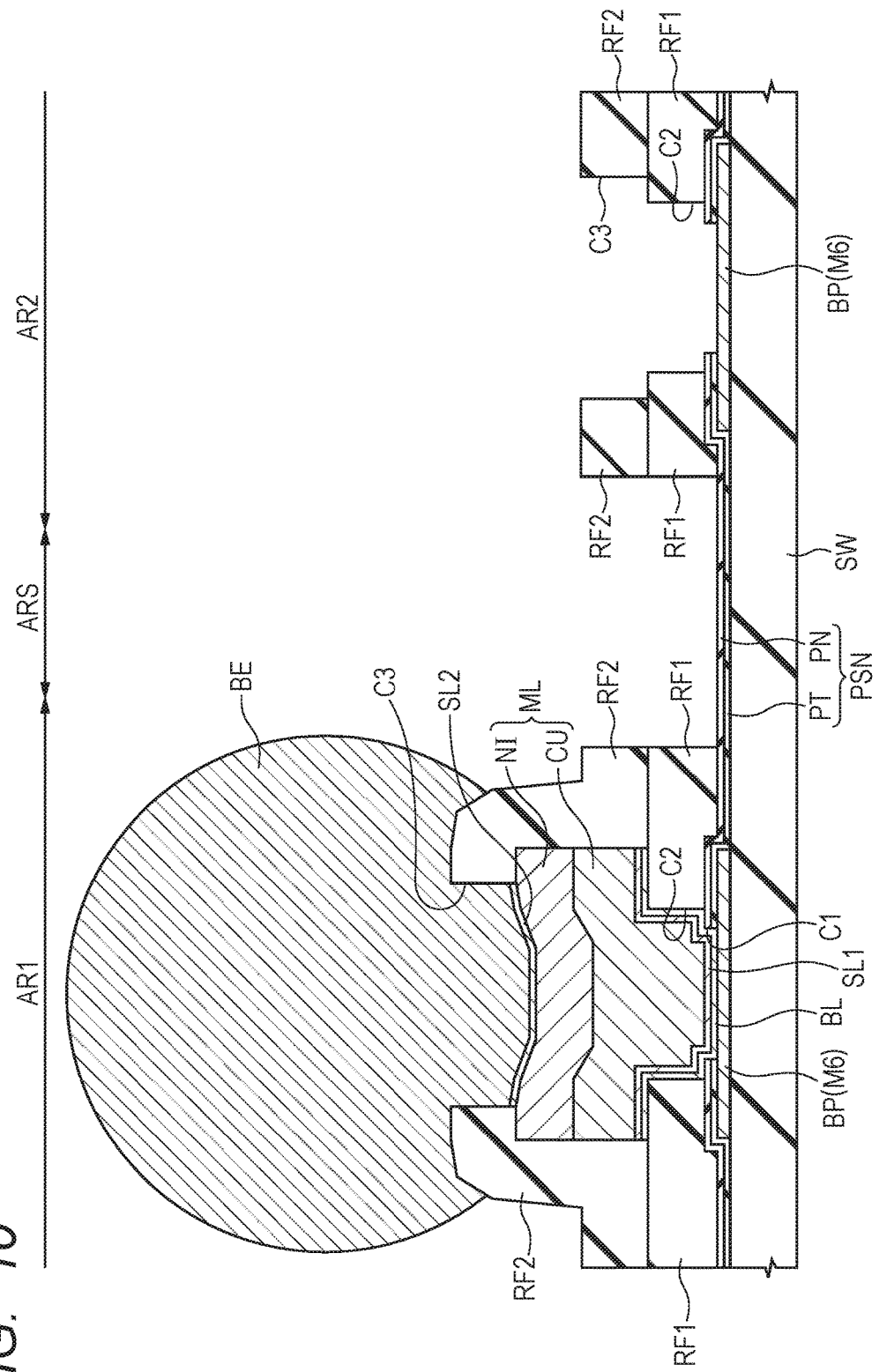
FIG. 10 is a sectional view showing another semiconductor device manufacturing process continued from FIG. 9.

Next, as shown in FIG. 10, a seed layer SL2 made of gold (Au) is formed over the exposed electrode layer ML. Thereafter, bump electrodes BE are formed over the electrode layer ML via the seed layer SL2. The bump electrodes BE are electrodes that couple with the outside and are made of lead (Pb)-free solder, for example. The diameter of each bump electrode BE is about 60 to 100 µm, for example.

The bump electrodes BE are typically formed by a printing method, a plating method, or a ball bumping process. The printing method involves mask printing of solder paste onto the electrode layer ML via the seed layer SL2. The solder paste is then formed into balls by reflow treatment, the balls being coupled electrically to the electrode layer ML. The plating method involves plating a solder layer over the electrode layer ML via the seed layer SL2, before applying flux to the solder layer. The solder layer is then formed into balls by reflow treatment and by removal of flux residuals through cleaning, the balls being coupled electrically to the electrode layer ML. The ball bumping process involves mask printing of flux onto the electrode layer ML, before mounting solder balls over the flux. The solder balls are subjected to reflow treatment and removal of flux residuals through cleaning, before being coupled electrically to the electrode layer ML.

Then as shown in FIG. 11, before the back of the semiconductor wafer SW is ground, a protective tape PR is prepared which is to be applied to the principal plane of the semiconductor wafer SW in a manner covering a plurality of bump electrodes BE. The protective tape PR is made up of a base layer PR1, a glue layer PR3, and an intermediate layer PR2 interposed between the base layer PR1 and the glue layer PR3. The intermediate layer PR2 and the glue layer PR3 are softer than the base layer PR1, thus encompassing the bump electrodes BE when applied and suitably filling the level differences over the principal plane of the semiconductor wafer SW. The base layer PR1 is about 120 µm thick, the intermediate layer PR2 is about 200 µm thick, and the glue layer PR3 is about 5 µm thick, for example.

The glue layer PR3 has an adhesive force of about 9.8 N/25 mm. The glue layer PR3 has the property of adhering strongly to the second protective film RF2 made of photosensitive polyimide but weakly to the insulating film PSN formed of silicon oxide or silicon nitride.

Then as shown in FIG. 12, the protective tape PR is applied to the principal plane of the semiconductor wafer SW. The intermediate layer PR2 and the glue layer PR3 are well suited to fill the level differences over the principal plane of the semiconductor wafer SW. This property allows the intermediate layer PR2 and the glue layer PR3 to encompass the bump electrodes BE. Also, the intermediate layer PR2 and the glue layer PR3 can fill the inside of the second openings C2 famed in the first protective film RF1 and the inside of the third openings C3 formed in the second protective film RF2 over the pseudo chip area AR2, as well as the scribe areas ARS.

The back of the semiconductor wafer SW is then ground while grinding water is being supplied to the semiconductor wafer SW. As described above, the inside of the second openings C2 formed in the first protective film RF1 and the inside of the third openings C3 formed in the second protective film RF2 over the pseudo chip area AR2, as well as the scribe areas ARS are filled with the protective tape PR. This prevents the intrusion of grinding water onto the product chip area AR1.

The protective tape PR is then peeled off from the principal plane of the semiconductor wafer SW. As described above, the glue layer PR3 has the property of adhering strongly to the second protective film RF2 made of photosensitive polyimide but weakly to the insulating film PSN famed of silicon oxide or silicon nitride. Thus in this embodiment, the second protective film RF2 is not formed over the entire pseudo chip area AR2, with the insulating film PSN partially exposed. This structure allows the protective tape PR to peel off more easily from the principal plane of the semiconductor wafer SW than if the wall made of photosensitive polyimide is formed around the peripheral region of the semiconductor wafer SW (see the explanation above in reference to FIG. 4).

Thereafter, the scribe areas ARS are cut up to form the semiconductor wafer SW into individual semiconductor chips, whereby semiconductor products are finished. The processes involved here will not be described further.

<<Variations>>

Described below with reference to FIGS. 13 to 16 are variations of the embodiment each included by a semiconductor wafer with a plurality of semiconductor chips formed thereon. FIGS. 13, 14, 15, and 16 are top views showing respectively a first variation, a second variation, a third variation, and a fourth variation of the embodiment, each top view magnifying partially the state of the principal plane of a semiconductor wafer where a plurality of semiconductor chips are formed.

The pseudo chips SC2 shown in FIG. 2 have the second openings C2 and the third openings C3 formed in the first protective film RF1 and in the second protective film RF2, respectively, each opening having a round shape in planar view. However, the round-shaped openings are not limitative of the present invention.

Figure 13:
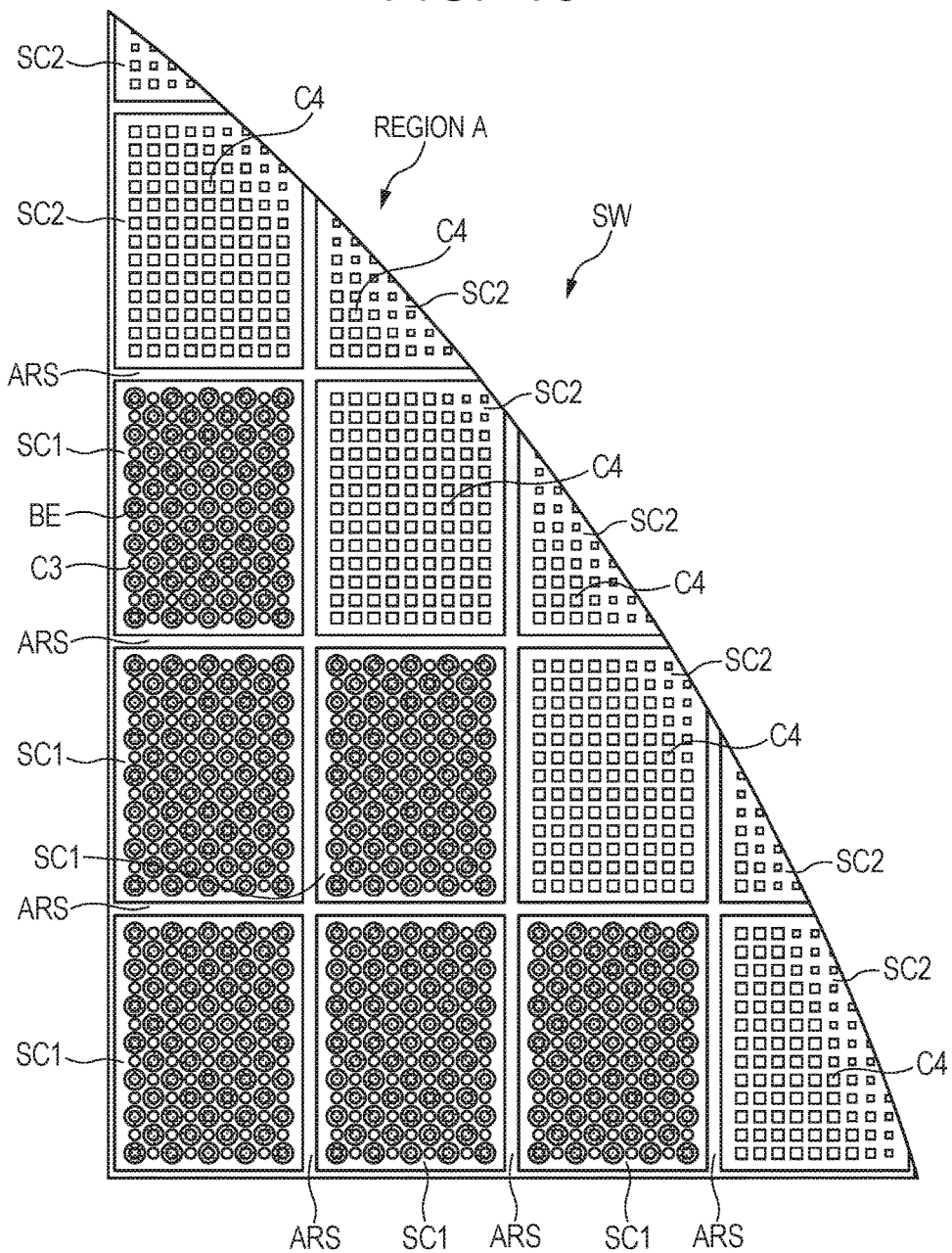
FIG. 13 is a top view magnifying partially the state of the principal plane of a semiconductor wafer where a plurality of semiconductor chips are formed as a first variation of the embodiment.

Alternatively, as shown in FIG. 13 depicting the first variation, a plurality of fourth openings C4 formed in the first and the second protective films of the pseudo chips SC2 may have a rectangular shape each in planar view.

Figure 14:
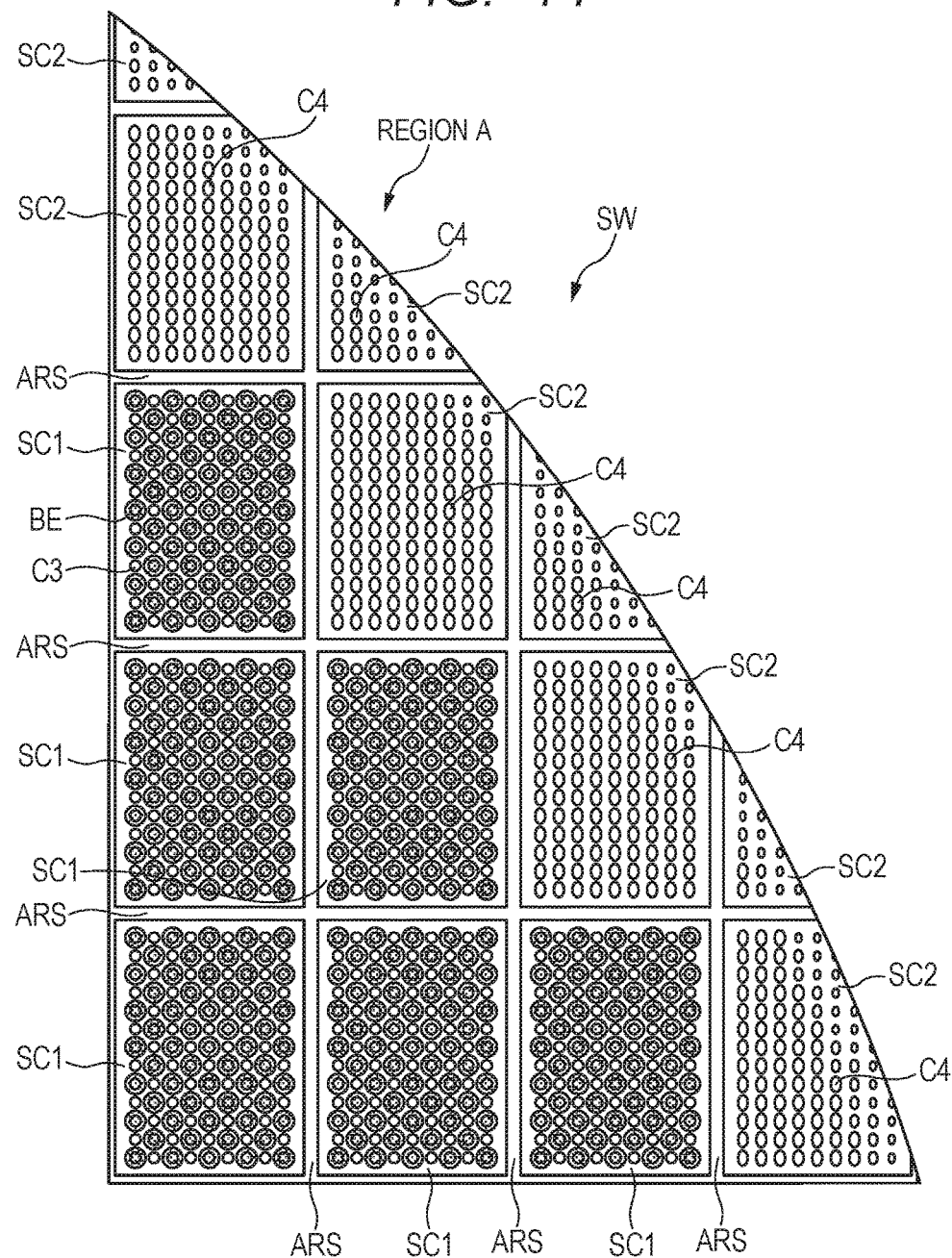
FIG. 14 is a top view magnifying partially the state of the principal plane of a semiconductor wafer where a plurality of semiconductor chips are formed as a second variation of the embodiment.

In another alternative, as shown in FIG. 14 depicting the second variation, a plurality of fourth openings C4 formed in the first and the second protective films of the pseudo chips SC2 may have an elliptical shape each in planar view.

Figure 15:
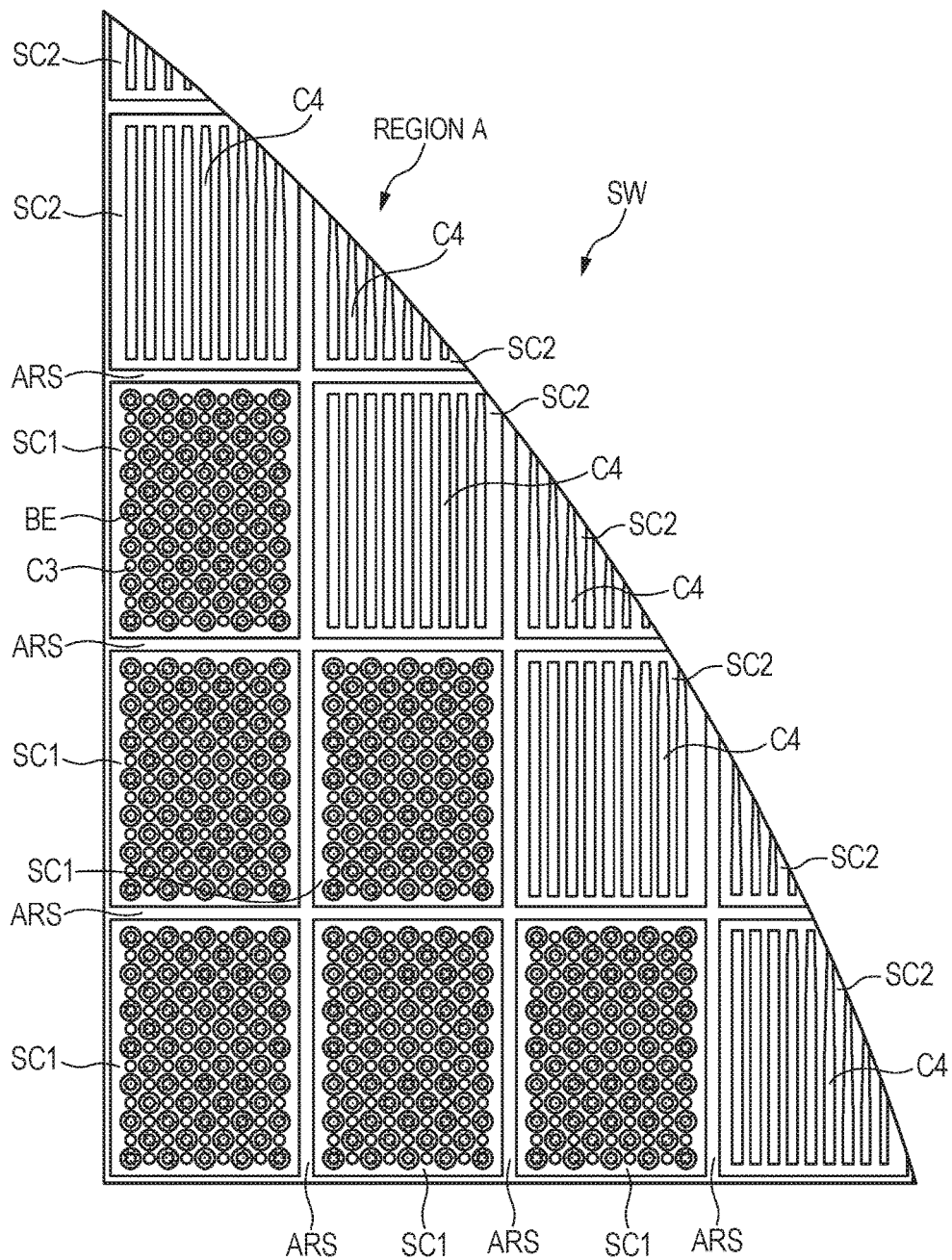
FIG. 15 is a top view magnifying partially the state of the principal plane of a semiconductor wafer where a plurality of semiconductor chips are formed as a third variation of the embodiment.

In still another alternative, as shown in FIG. 15 depicting the third variation, a plurality of fourth openings C4 famed in the first and the second protective films of the pseudo chips SC2 may have a stripe shape each in planar view.

Figure 16:
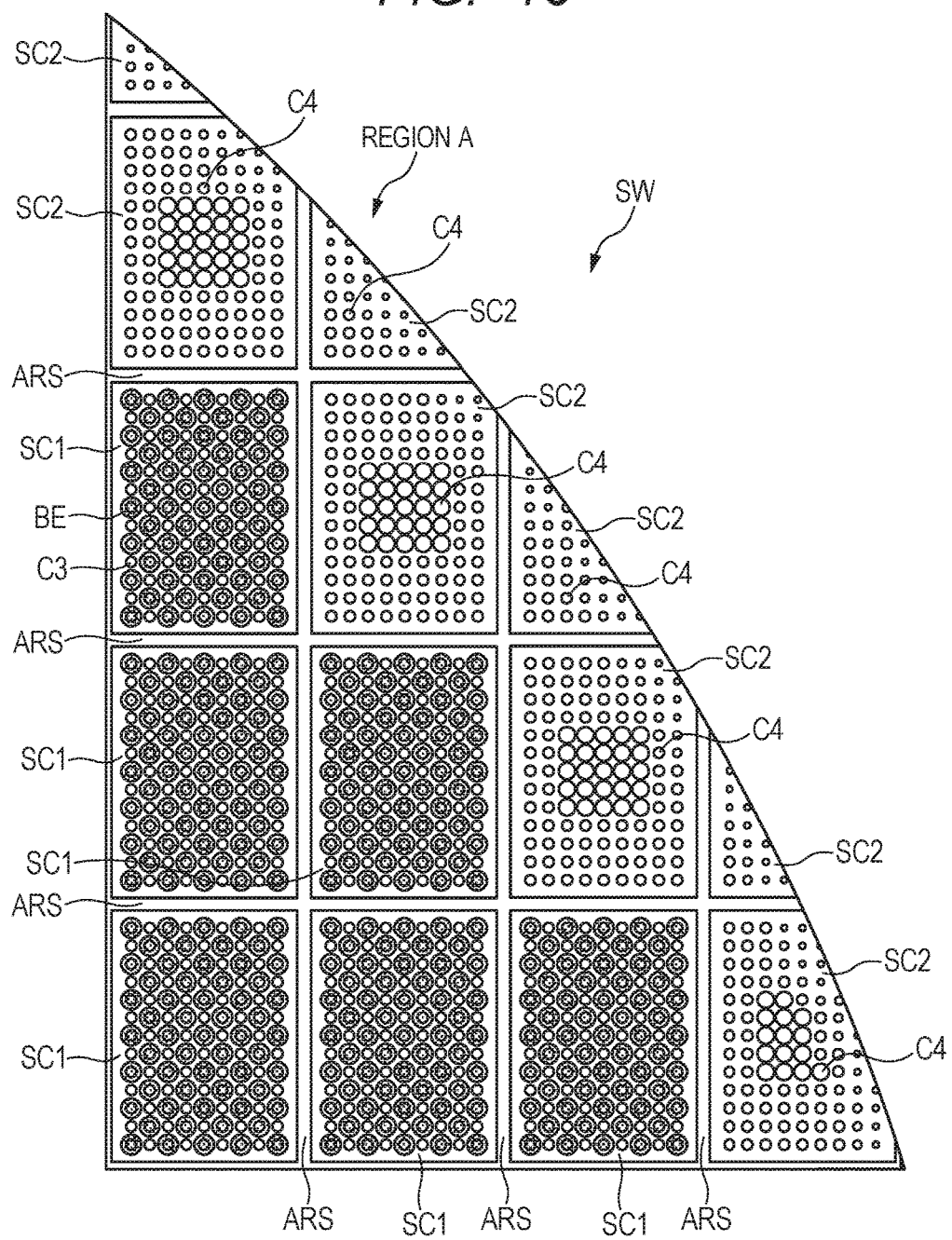
FIG. 16 is a top view magnifying partially the state of the principal plane of a semiconductor wafer where a plurality of semiconductor chips are formed as a fourth variation of the embodiment.

In still another alternative, as shown in FIG. 16 depicting the fourth variation, a plurality of fourth openings C4 formed in the first and the second protective films of the pseudo chips SC2 may each have a round shape of a different diameter in planar view. In the fourth variation of FIG. 16, the fourth openings C4 in the middle of each pseudo chip SC2 each have a diameter larger than the remaining fourth openings C4. However, this is not limitative of the present invention. Alternatively, the fourth openings may be formed in any manner desired. For example, fourth openings having a first diameter each may be arranged in the middle of the chip; the fourth openings with the first diameter each may be surrounded externally by fourth openings each having a second diameter larger than the first diameter; the fourth openings with the second diameter each may be further surrounded externally by fourth openings having the first diameter each; the fourth openings with the first diameter each may be further surrounded externally by fourth openings having the second diameter each, and so on.

Exposed at the bottom of the fourth openings C4 is an insulating film formed of silicon nitride, of silicon oxide, or of a stacked film made of silicon nitride and silicon oxide.

As described above, the adhesive force between photosensitive polyimide and the protective tape is high, while the adhesive force between the protective tape and the insulating film made of silicon nitride or silicon oxide is low. Thus as long as a desired exposed surface area of the insulating film is obtained, the shape of each fourth opening C4 in planar view may be varied as desired.

As explained above for the above-described pseudo chips SC2 in FIG. 2, the second openings C2 are formed in one process that exposes and develops the first protective film RF1 and the third openings C3 are formed in another process that exposes and develops the second protective film RF2. By contrast, in the first, the second, the third, and the fourth variations of the embodiment, the fourth openings C4 may be formed in a single process that exposes and develops the stacked film made of the first and the second protective films of the pseudo chips SC2.

The first, the second, the third, and the fourth variations need two exposure masks: one used to form the third openings C3 in the second protective film of the product chip area SC1, and the other used to form the fourth openings C4 in the first and the second protective films of the pseudo chip area SC2. Using two different exposure masks makes it possible to determine as desired the quantity and shape of the fourth openings C4 to be formed in the pseudo chip area SC2 regardless of the quantity and shape of the third openings C3 to be formed in the product chip area SC1. This in turn makes it easier to adjust the adhesive force of the protective tape and the degree of the ease of peeling off the tape.

Figure 17:
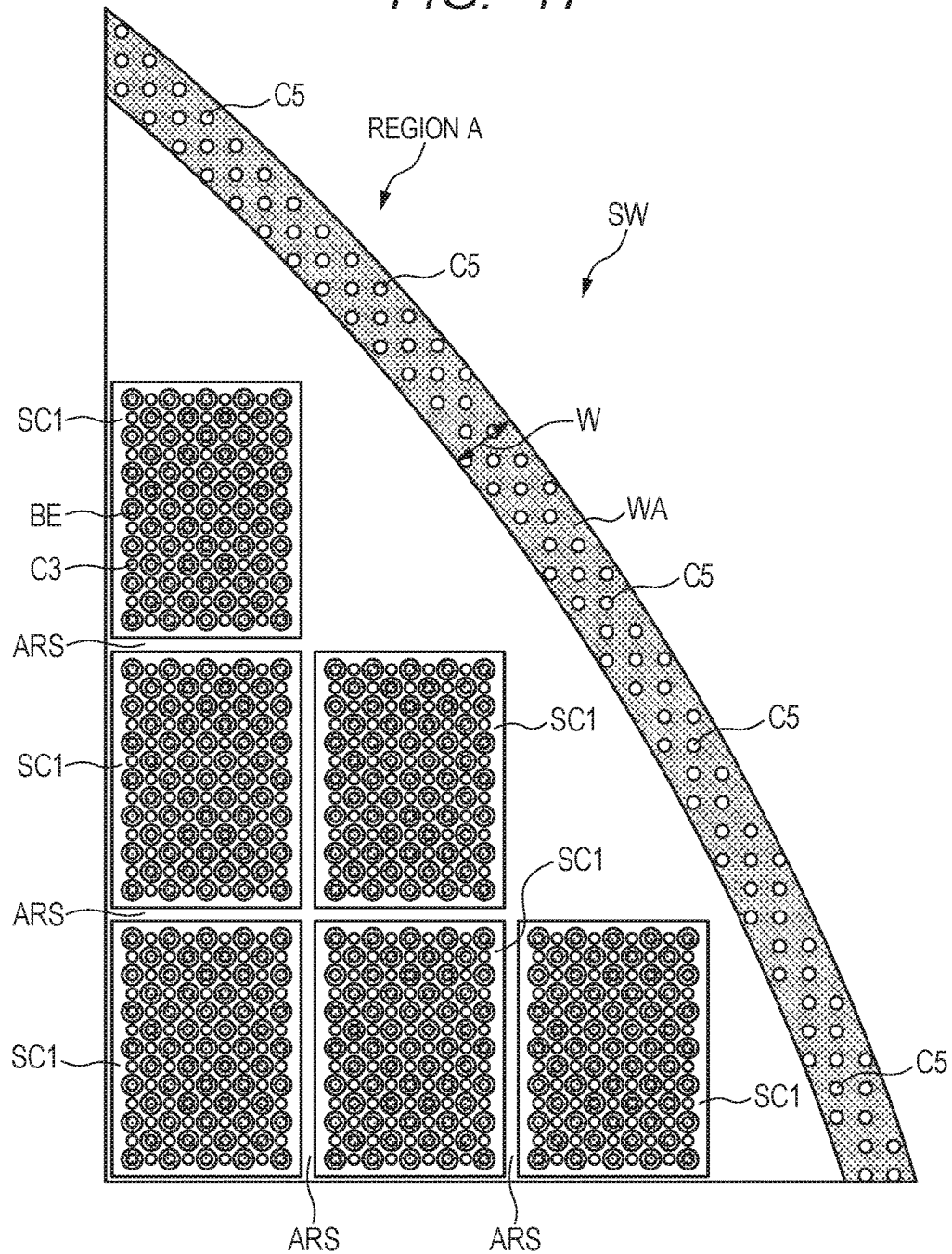
FIG. 17 is a top view magnifying partially the state of the principal plane of a semiconductor wafer where a plurality of semiconductor chips are formed as a fifth variation of the embodiment.

Explained below using FIG. 17 is a semiconductor wafer where a plurality of semiconductor chips are formed as still another variation of the embodiment. FIG. 17 is a top view magnifying partially the state of the principal plane of the semiconductor wafer where a plurality of semiconductor chips are fabricated as a fifth variation of the embodiment.

Over the above-described semiconductor wafer SW shown in FIG. 1, incomplete pseudo chips SC2 failing to make up product chips SC1 are formed in the peripheral region.

By contrast, in the fifth variation shown in FIG. 17, no pseudo chips SC2 are famed in the periphery. Instead, in the peripheral region of the semiconductor wafer SW, a wall WA is formed by a stacked film made of the first and the second protective films. The width W of the wall WA is about 2 mm as measured from the circumferential edge of the semiconductor wafer WS, for example. Fifth openings C5 are formed in the first and the second protective films including the wall WA surrounding the peripheral region.

Exposed at the bottom of the fifth openings C5 is an insulating film formed of silicon nitride, of silicon oxide, or of a stacked film made of silicon nitride and silicon oxide.

As described above, the adhesive force between photosensitive polyimide and the protective tape is high, while the adhesive force between the protective tape and the insulating film made of silicon nitride or silicon oxide is low. In view of this, forming the wall WA made of photosensitive polyimide having a plurality of fifth openings C5 therein reduces the adhesive force to the protective tape. This makes it easier to peel off the protective tape from the principal plane of the semiconductor wafer SW.

For the above-described pseudo chips SC2 shown in FIG. 2, the second openings C2 are formed in one process that exposes and develops the first protective film RF1, and the third openings C3 are formed in another process that exposes and develops the second protective film RF2. By contrast, in the fifth variation of the embodiment, the fifth openings C5 are formed in a single process that exposes and develops the first and the second protective films making up the wall WA.

The fifth variation needs two exposure masks: one used to form the third openings C3 in the second protective film of the product chip area SC1, and the other used to form the fifth openings C5 in the first and the second protective films of the peripheral region. Using two different exposure masks makes it possible to determine as desired the quantity and shape of the fifth openings C5 to be formed in the peripheral region regardless of the quantity and shape of the third openings C3 to be formed in the product chip area SC1. This in turn makes it easier to adjust the adhesive force of the protective tape and the degree of the ease of peeling off the tape.

According to the present invention embodied as described above, it is easy to peel off the protective tape PR from the principal plane of the semiconductor wafer SW when the back of the semiconductor wafer SW is ground. This improves the yield of manufacturing semiconductor devices.

While preferred embodiments of this invention have been described using specific terms, such description is for illustrative purposes only, and it is to be understood that changes and variations may be made without departing from the spirit or scope of the claims that follow.

What is claimed is:

1. A semiconductor device manufacturing method comprising:
   (a) preparing a semiconductor wafer having:
      a principal plane,
      a circumferential edge surrounding the principal plane,
      a plurality of first chips formed over the principal plane and including semiconductor integrated circuits, respectively, and
      a plurality of second chips surrounding the first chips and contiguous with the circumferential edge,
      each of the first chips having a plurality of bonding pads formed therein;
   (b) forming an insulating film over the principal plane;
   (c) forming a plurality of first openings in the insulating film of the first chips to expose the bonding pads at respective bottoms of the first openings;
   (d) forming a first protective film over the principal plane;
   (e) forming a plurality of second openings in the first protective film of the first and the second chips in such a manner that the bonding pads are exposed at the respective bottoms of the first openings coinciding with the second openings in planar view of the first chips and that the insulating film is exposed at respective bottoms of the second openings of the second chips;
   (f) forming a plurality of electrode layers coupled electrically to each of the bonding pads via the first and the second openings;
   (g) forming a second protective film over the principal plane;
   (h) forming a plurality of third openings in the second protective film of the first and the second chips in such a manner that the electrode layers are exposed at respective bottoms of the third openings of the first chips and that the insulating film is exposed at the respective bottoms of the second openings coinciding with the third openings in planar view of the second chips;
   (i) forming a plurality of external electrodes coupled electrically to each of the electrode layers, and
   (j) after (i), applying a protective tape to the principal plane in a manner covering the external electrodes.

2. The semiconductor device manufacturing method according to claim 1,
   wherein an opening space of the third opening of the second chips closest to the circumferential edge is smaller than an opening space of each of the third openings of the first chips.

3. The semiconductor device manufacturing method according to claim 1, wherein a pitch of the third openings of the second chips is the same as a pitch of the third openings of the first chips.

4. The semiconductor device manufacturing method according to claim 1,
   wherein the external electrodes are not formed in the second chips.

5. The semiconductor device manufacturing method according to claim 1,
   wherein the first chips adjacent to each other, the second chips adjacent to each other, and the first and the second chips adjacent to each other are separated from each other by scribe areas; and
   wherein the first and the second protective films are not formed in the scribe areas.

6. A semiconductor device manufacturing method comprising:
   (a) preparing a semiconductor wafer having:
      a principal plane,
      a circumferential edge surrounding the principal plane,
      a plurality of first chips formed over the principal plane and including semiconductor integrated circuits, respectively, and
      a plurality of second chips surrounding the first chips and contiguous with the circumferential edge,
      each of the first chips having a plurality of bonding pads formed therein;
   (b) forming an insulating film over the principal plane;
   (c) forming a plurality of first openings in the insulating film of the first chips to expose the bonding pads at respective bottoms of the first openings;
   (d) forming a first protective film over the principal plane;
   (e) forming a plurality of second openings in the first protective film of the first chips in such a manner that the bonding pads are exposed at the respective bottoms of the first openings coinciding with the second openings in planar view;
   (f) forming a plurality of electrode layers coupled electrically to each of the bonding pads via the first and the second openings;
   (g) forming a second protective film over the principal plane;
   (h) forming a plurality of third openings in the second protective film of the first chips to expose the electrode layers at respective bottoms of the third openings while forming a plurality of fourth openings in the first and the second protective films of the second chips to expose the insulating film at respective bottoms of the fourth openings;
   (i) forming a plurality of external electrodes coupled electrically to each of the electrode layers; and
   (j) after (i), applying a protective tape to the principal plane in a manner covering the external electrodes.

7. The semiconductor device manufacturing method according to claim 6,
   wherein each of the fourth openings has a round shape, an elliptical shape, a rectangular shape, or a stripe shape in planar view.

8. The semiconductor device manufacturing method according to claim 6, wherein the external electrodes are not formed in the second chips.

9. The semiconductor device manufacturing method according to claim 6,
wherein the first chips adjacent to each other, the second chips adjacent to each other, and the first and the second chips adjacent to each other are separated from each other by scribe areas; and
wherein the first and the second protective films are not formed in the scribe areas.

10. A semiconductor wafer comprising:
a principal plane;
a circumferential edge surrounding the principal plane;
a plurality of first chips formed over the principal plane and including semiconductor integrated circuits, respectively;
a plurality of second chips surrounding the first chips and contiguous with the circumferential edge;
a plurality of bonding pads formed in each of the first chips;
an insulating film formed over the principal plane in a manner covering the bonding pads;
a plurality of first openings formed in the insulating film of the first chips in a manner partially exposing the top of the bonding pads;
a first protective film formed over the insulating film;
a plurality of second openings formed in the first protective film of the first chips in a manner coinciding with the first openings in planar view to partially expose the top of the bonding pads;
a plurality of third openings formed in the first protective film of the second chips to expose the insulating film;
a plurality of electrode layers coupled electrically to each of the bonding pads via the first and the second openings;
a second protective layer formed over the principal plane in a manner covering the electrode layers;
a plurality of fourth openings formed in the second protective film of the first chips to partially expose the top of the electrode layers;
a plurality of fifth openings formed in the second protective film of the second chips in a manner coinciding with the third openings in planar view to expose the insulating film;
a plurality of external electrodes coupled electrically to each of the electrode layers via the fourth openings; and
a protective tape applied to the principal plane in a manner covering the external electrodes.

11. The semiconductor wafer according to claim 10,
wherein an opening space of the fifth opening of the second chips closest to the circumferential edge is smaller than an opening space of each of the fourth openings of the first chips.

12. The semiconductor wafer according to claim 10,
wherein a pitch of the fifth openings of the second chips is the same as a pitch of the fourth openings of the first chips.

13. The semiconductor wafer according to claim 10,
wherein each of the fifth openings has a round shape, an elliptical shape, a rectangular shape, or a stripe shape in planar view.

14. The semiconductor wafer according to claim 10,
wherein the external electrodes are not formed in the second chips.

15. The semiconductor wafer according to claim 10,
wherein the protective tape is in contact with the first protective film, the second protective film, and the insulating film exposed at a bottom of each of the third openings.

16. The semiconductor wafer according to claim 10,
wherein the first chips adjacent to each other, the second chips adjacent to each other, and the first and the second chips adjacent to each other are separated from each other by scribe areas; and
wherein, in the scribe areas, the first and the second protective films are not formed, and the protective tape is in contact with the insulating film.

17. The semiconductor wafer according to claim 10,
wherein an adhesive force between the protective tape and the insulating film is lower than an adhesive force between the protective tape and the first and the second protective films combined.

18. The semiconductor wafer according to claim 10,
wherein the protective tape is made of a glue layer, a base layer, and an intermediate layer interposed between the glue layer and the base layer;
wherein the glue layer and the intermediate layer are softer than the base layer; and
wherein a thickness of the glue layer and the intermediate layer combined is greater than a height of each of the external electrodes.

19. The semiconductor wafer according to claim 10,
wherein the insulating film is a silicon nitride film, a silicon oxide film, or a stacked film made of the silicon nitride film and the silicon oxide film, and
wherein each of the first and the second protective films is a polyimide film.

20. The semiconductor wafer according to claim 10,
wherein an opening space of each of the third openings is the same in planar view as an opening space of each of the fifth openings.

* * * * *